(12) United States Patent
Ogura et al.

(10) Patent No.: US 6,177,318 B1
(45) Date of Patent: Jan. 23, 2001

(54) INTEGRATION METHOD FOR SIDEWALL SPLIT GATE MONOS TRANSISTOR

(75) Inventors: Seiki Ogura, Wappingers Falls, NY (US); Yutaka Hayashi, Tsukuba (JP); Tomoko Ogura, Wappingers Falls, NY (US)

(73) Assignee: Halo LSI Design & Device Technology, Inc., Wappingers Falls, NY (US)

(*) Notice: Under 35 U.S.C. 154(b), the term of this patent shall be extended for 0 days.

(21) Appl. No.: 09/419,561

(22) Filed: Oct. 18, 1999

(51) Int. Cl.[7] ............................................. H01L 21/8247
(52) U.S. Cl. .................. 438/267; 438/286; 438/258; 438/259
(58) Field of Search ............................... 438/257–267, 438/286

(56) References Cited

U.S. PATENT DOCUMENTS

| | | | |
|---|---|---|---|
| 5,494,838 | * | 2/1996 | Chang et al. . |
| 5,496,753 | * | 3/1996 | Sakurai et al. . |
| 5,776,787 | * | 7/1998 | Keshtbod . |
| 5,780,341 | | 7/1998 | Ogura ..................................... 438/259 |
| 5,789,297 | * | 8/1998 | Wang et al. ........................... 438/267 |
| 5,824,584 | * | 10/1998 | Chen et al. ........................... 438/267 |
| 5,851,881 | * | 12/1998 | Lin et al. ............................. 438/261 |
| 5,930,631 | * | 7/1999 | Wang et al. .......................... 438/286 |
| 6,107,141 | * | 8/2000 | Hsu et al. ............................. 438/267 |

OTHER PUBLICATIONS

Chang et al., "A New SONOS Memory Using Source–Side Injection for Programming," IEEE Electron Device Letters, vol. 19, No. 7, pp. 253–255, Jul. 1998.

Ogura et al., "Low Voltage, Low Current, High Speed Program Step Split Gate Cell with Ballistic Direct Injection for EEPROM/Flash," IEDM 1998, p. 987.

* cited by examiner

Primary Examiner—Richard Booth
(74) Attorney, Agent, or Firm—George O. Saile; Stephen B. Ackerman; Rosemary L.S. Pike

(57) ABSTRACT

A fabrication method for an electrically programmable read only memory device, which consists of a control/word gate and a MONOS control gate on the side wall of the control gate. The unique material selection and blocking mask sequences allow simple and safe fabrication within the delicate scaled CMOS process environment, of a sidewall MONOS control gate with an ultra short channel under the control gate, which involves double side wall spacer formation i.e., a disposable side wall spacer and the final polysilicon spacer gate.

24 Claims, 7 Drawing Sheets

*FIG. 1a – Prior Art*

Silicon surface A,B corresponds to the position of A,B in Fig 6a

INTEGRATION METHOD FOR SIDEWALL SPLIT GATE MONOS TRANSISTOR

BACKGROUND OF THIS INVENTION

1) Field of the Invention

This invention relates to a fabrication method for an electrically programmable read-only, split gate MONOS (Metal/polysilicon Oxide Nitride Oxide silicon) memory having a composite of oxide-nitride-oxide (ONO) underneath the control gate in which high efficiency of channel hot electron injection from channel to silicon nitride can be achieved.

2) Description of the Prior Art

Side wall polysilicon gates with MONOS structure was reported by Kuo-Tung Chang et al in the paper "A New SONOS Memory Using Source Side Injection for Programming" in IEEE Electron Letter, Vol. 19, No. 7, July 1998. In the structure, a channel potential drop is formed at the gap between the sidewall gate and the select gate (word) such that the channel electron are accelerated in this gap region and become hot enough to inject into the oxide-nitride-oxide layer (trapped in the nitride layer) underneath the sidewall gate.

As shown in FIG. 1a, the typical sidewall process forms spacers on both sides of the word gate. This source side hot electron injection, which is commonly used in floating gate nonvolatile memory was first time employed for MONOS memory programming by Kuo-Tung Chang et al. In the similar structure, when the gate channel is reduced to less than 40 nm (Kuo-Tung Chang et al's channel length is about 200 nm), a new and much more efficient injection mechanism (Ballistic injection) takes over instead of source side injection as predicted in the S. Ogura U.S. Pat. No. 5,780,341. The ballistic injection mechanism has been proved by S. Ogura in the paper "Step Split Gate Cell with Ballistic Direct Injection for EEPROM/Flash" in IEDM 1998, pp. 987. As shown in FIG. 1b, when the control gate channel length is even 100 nm (Kuo-Tung Chang et al's channel length is twice as large that is 200 nm), the injection mechanism becomes source side injection which requires high floating gate potential above 5 volts. However, when the memory gate becomes less than 40 nm and the channel is properly doped, a ballistic injection device can be formed.

Because most of the embedded logic applications utilize only one side of polysilicon, one memory element word gate, the unused side spacer is removed or disabled. It is possible to disable the effect of unwanted side of control gate by implants of N− dopants such as Arsenic or Phosphorus under the unwanted gate using a block mask, prior to formation of the sidewall spacer, in order to short the unwanted gate to the adjacent diffusion. In another approach, the unwanted polysilicon gate material is used to fill the self aligned contact, as shown by Seiki Ogura in U.S. Pat. No. 5,780,341.

However, in integrating the Split Gate MONOS Transistor and high voltage devices in logic technology an optimum process which provides simplicity and reliability has to be considered. The logic gates, high voltage gates, and memory gates are all dimensionally critical and their relative positions are important. Therefore, it is preferable to define all three types of devices together at once rather than by separate masking processes. However, this preferred idea faces difficulty once the logic gate oxide becomes thin as 3.0 nm in the 0.18 micron feature size technology.

If the logic gates are formed prior to the side wall gates, the side wall spacers on the logic gates need to be removed, and the edges of the logic gate oxide could be damaged during the removal. On the other hand, if the logic gates are defined by a second critical mask after the memory word gates and spacer gates have been defined and formed, the damage to the logic gates' oxide during spacer removal, can be avoided. But the second approach requires two critical masks to define memory word gate and logic gate separately.

SUMMARY OF THE INVENTION

It is a principal object of this invention to (i) define controllably the ultra short channel, small size by sidewall technique for fast program at low voltage utilizing the Ballistic injection mechanism and (ii) define all three types of devices together at once rather than by separate masking processes.

It is a further object of this invention to form the sidewall polysilicon gate only on one side of the memory cell, but not to form the sidewall polysilicon gate on the logic and high voltage devices.

In the present invention, a new integration process is introduced, in which one critical mask is used to define all of the logic gates, high voltage devices, and the memory cells. But the side wall polysilicon gate is formed only on one side of the memory cell, where the MONOS control gate is wanted. Using a single critical mask step, simplifies the number of process steps and saves cost. An additional advantage of this process is the use of a logic gate side wall insulator, which protects the memory cells.

The channel length under the MONOS control gate is between preferably about 25 to 50 nm and is defined by first side wall spacer. The step edge is also defined by this first disposable side wall spacer, during step split transistor fabrication. The length of the N region is determined by the difference between the last polysilicon spacer and the first spacer thickness. The unique material selection and mask sequence allows formation of the side wall spacer gate on only one side of the split-word gate. Furthermore, logic gates are formed after forming of the sidewall MONOS control gates, thus protecting the delicate scaled complementary metal oxide semiconductor (CMOS) logic from the MONOS control gate process steps.

A fabrication method for an electrically programmable read-only memory device, which has high efficiency of electron injection from channel to silicon nitride layer is provided. This memory cell consists of a silicon word gate and a sidewall MONOS control gate on the sidewall of word gate. The MONOS control gate has an ultra short channel device formed by the double side wall spacer technique.

The uniqueness of this invention is to fabricate safely, the sidewall MONOS control gate involving double sidewall spacer process in the delicate scaled CMOS process environment, using the following techniques:

(1) a composite layer of thin silicon oxide layer and silicon nitride layer on normal gate polysilicon are defined at once for logic, high voltage and memory devices. Using another block mask, only one side of the memory gate is etched, where the MONOS control gate spacer should be formed.

(2) Disposable sidewall spacer forms only on the etched side of polysilicon layer, and defines the ultra short channel of between about 25 to 60 nm by blocking implant of arsenic N dopant by disposable spacer, in order to provide low voltage and high speed Channel Hot Electron (CHE) programming.

(3) The disposable sidewall spacer can be polysilicon, or doped polysilicon (which provides high etch rate compared to lightly doped silicon), or plasma deposited silicon oxynitride (which provides high etch rate compared to thermal silicon oxide) or chemical vapor deposited borophophosilicate glass.

(4) The final MONOS control gate is formed on only one side of word gate transistor, in both the flat channel and step channel processes.

(5) Logic gates are defined after formation of the memory devices. In embedded nonvolitile memory, such as nonvolitile randon access memory (NVRAM) or logic applications, the transistor count of logic is much higher than flash memory transistors, and the thinner silicon oxide logic devices are more delicate. Therefore, it is important to finish MONOS memory cell prior to logic device formation.

(6) Furthermore, all of the devices are defined by the original single critical mask.

(7) Logic spacer insulator is utilized to protect the memory cells.

BRIEF DESCRIPTION OF THE DRAWINGS

FIG. 1a shows the prior art device structure fabricated which has sidewall SONOS (Silicon Oxide Nitride Oxide Silicon) gates on the sides of the word gate. The channel under the SONOS control gate is larger than 100 nm, which provide source side injection.

DESCRIPTION OF THE PREFERRED EMBODIMENTS

Presented in this invention is a simple and problem-free fabrication method by which sidewall spacer gate formation for flat and/or step transistors, can be integrated with logic and high voltage device gate formation at the same time. The formation of shallow trench isolation, P-well, and N-well follows conventional CMOS process.

First, the two different gate silicon oxide thicknesses 222 and 221 for logic and memory word gate are formed. The polysilicon 245 for gate material is deposited by CVD, in the same manner as in a normal CMOS process. Deviation from the normal CMOS process starts after this polysilicon deposition. First, a very thin silicon oxide 231 (equal to between about 3 to 5 nm) is thermally or chemical vapor deposited (CVD) and followed by CVD silicon nitride 232 deposition thickness of between about 30 to 100 nm.

Figure 1B:
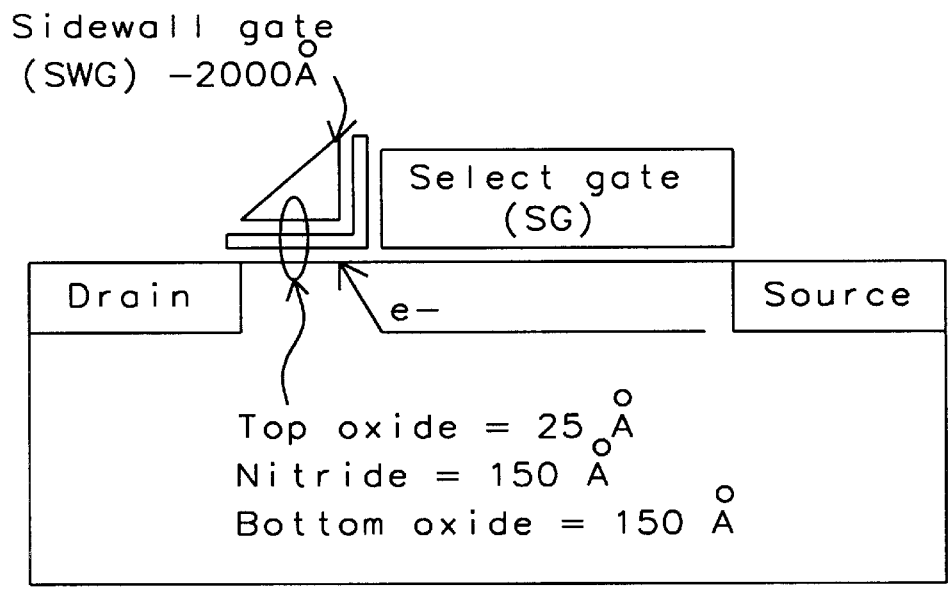
FIG. 1b show empirical hardware results that the floating gate channel length of about 100 nm requires high voltage for source side injection on operation and the short channel length of 40 nm injects electrons at low floating gate voltages (ballistic injection).
Figure 1B:
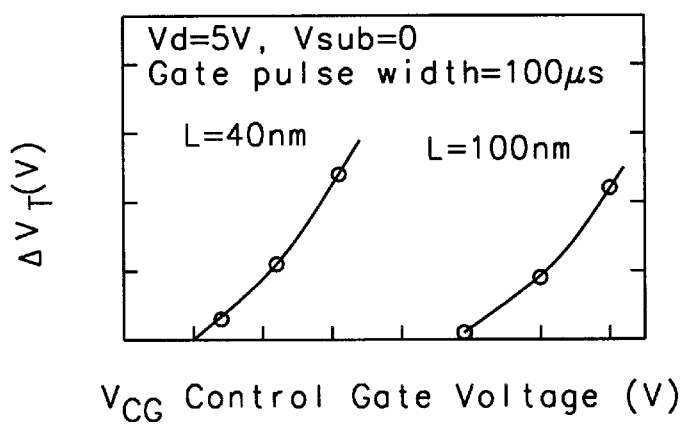
Figure 2A:
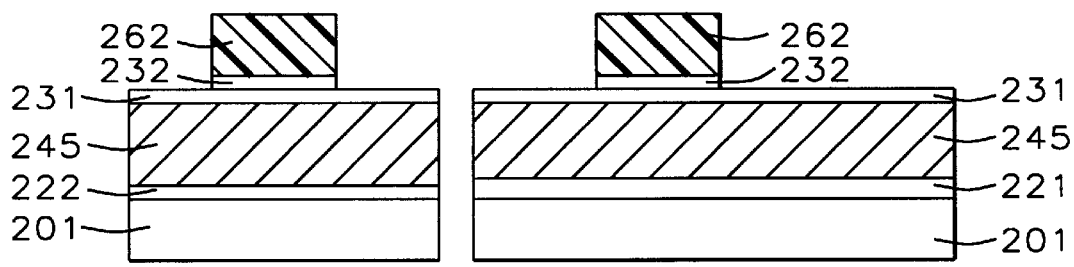
FIGS. 2a through 2j are cross-sectional illustration of the side wall short channel split gate MONOS transistor during various stages in the manufacturing process of the present invention.

Then photoresist layer 262 and a masking process with exposure and development to define logic, high voltage and memory gates are performed. The silicon nitride layer is now etched vertically by reactive ion etching (RIE), using the underlayer silicon oxide as the etch stop. This step is shown in FIG. 2a, where the left transistor is a logic device which has the thinner gate silicon oxide between about 3.5 to 6.0 nm and sidewall polysilicon gate should not be formed. This left device can also be high voltage device with a thick gate silicon oxide (between about 5 to 12 nm). Here the silicon oxide thicknesses and critical dimensions are chosen for example 0.25 micron feature size technology wherein then gate oxide is between about 7 to 9 nm. It is understood that these thicknesses and critical dimensions will scale with the technology as the critical dimension is reduced.

Figure 2B:
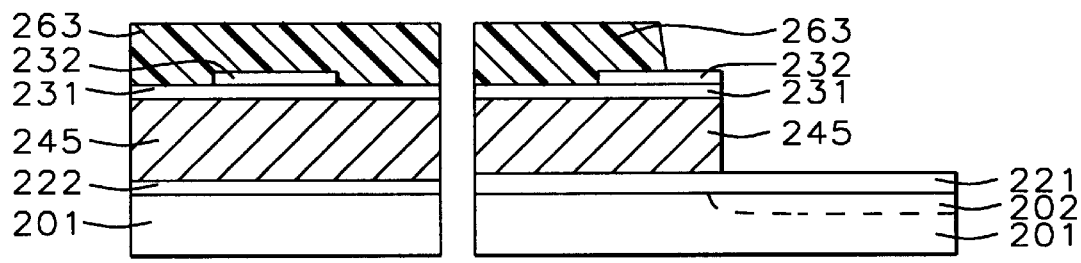

After removing the photoresist layer 262, another block mask 263 is applied to wherever the sidewall gate is wanted, as shown in FIG. 2b. Using the silicon nitride layer 232 as an etch stop layer, the right side of the first polysilicon is vertically etched. Then extra boron 202 is ion implanted at low energy (less than about 10 keV power and the ion dosage of between about 5 E 12 to 30 E 12 ions per cm$^2$, to adjust Vt under the floating gate.

Figure 2C:
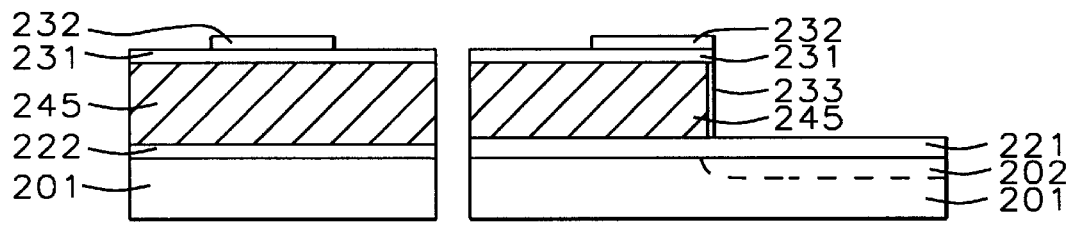
Figure 2D:
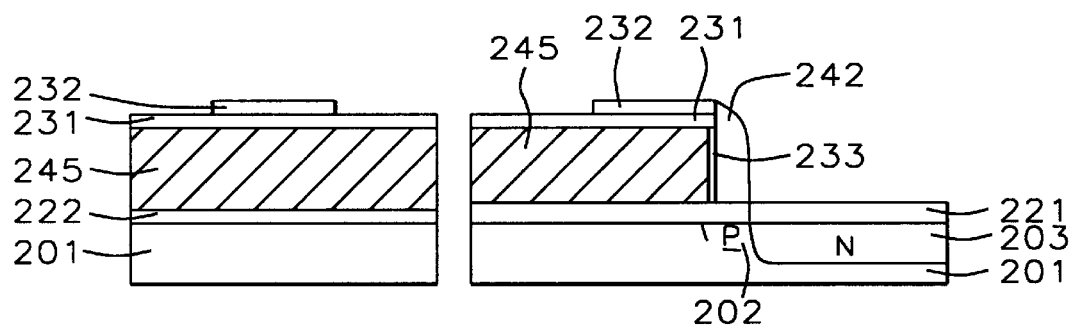
Figure 2E:
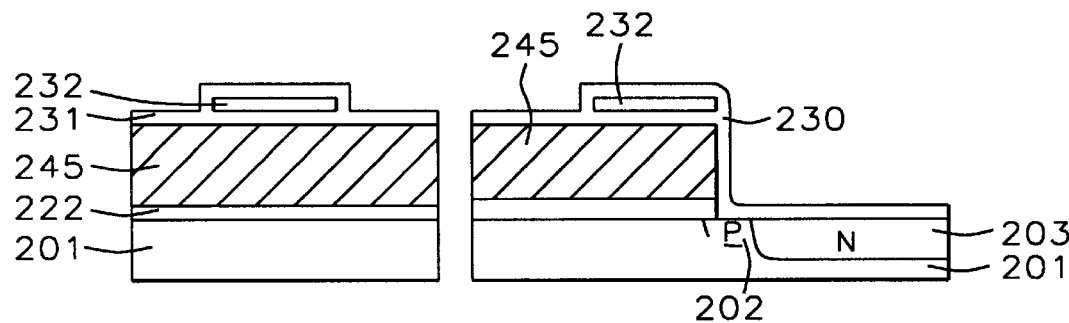
Figure 2F:
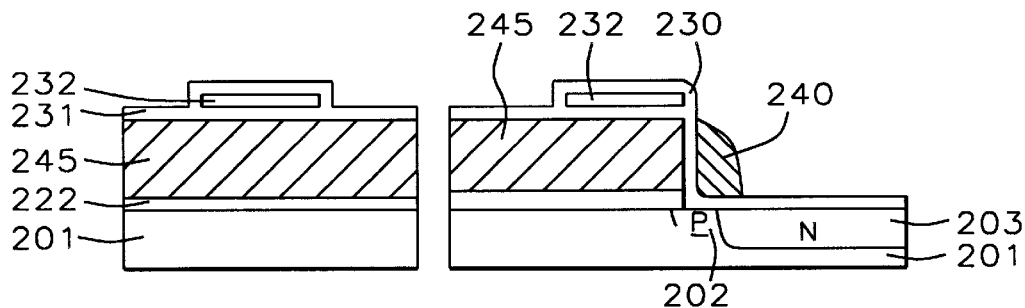
Figure 2G:
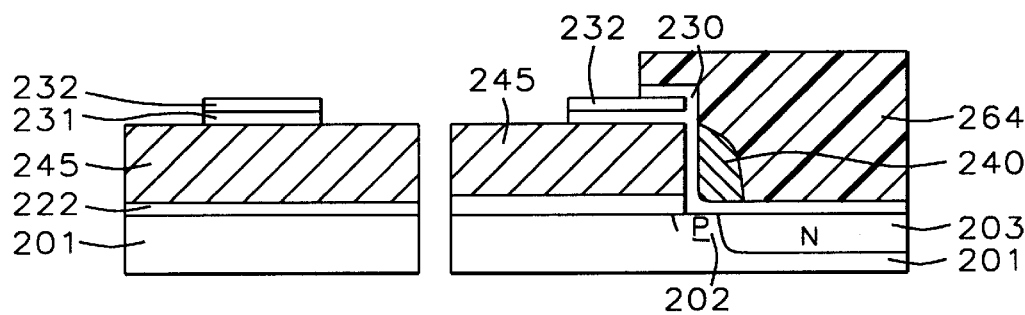
Figure 2H:
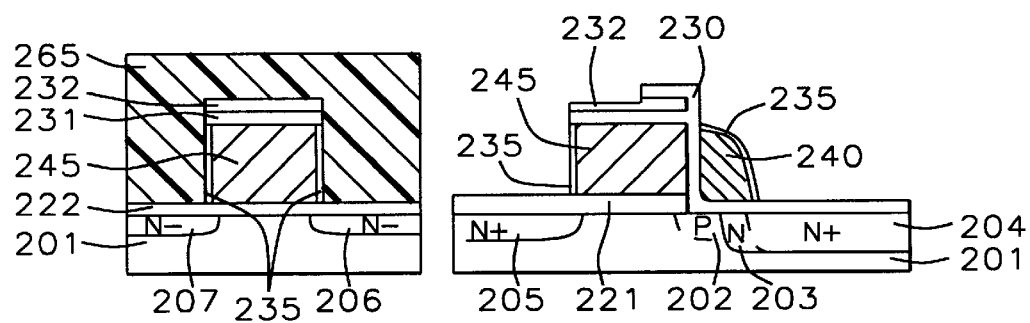

After removing the block mask photoresist layer 263, a thin silicon oxide layer 233 of less than about 5 nm is thermally grown on the sidewall polysilicon in FIG. 2c or CVD uniformly deposited as shown in FIG. 2c. A thin polysilicon layer typically having a thickness of between about 30 to 60 nm is then deposited. This polysilicon layer becomes a disposable sidewall spacer. Then the vertical or anisotropic polysilicon etch is performed, which forms the disposable side wall spacer 242. Implantation with an N-dopant 203 such as arsenic or phosphorus follows, as shown in FIG. 2d. Thus, the thickness of the polysilicon layer determines the effective channel length under the side wall floating gate. The effective channel length is designed to be as shorter than 50 nm (about 3 to 4 times of electron mean free length) and even as low as 30 nm or shorter as the technology advances in order to achieve very high injection efficiency.

Afterwards, the disposable side wall spacer 242 is gently removed by a dry chemical, isotropic etch. A typical etch ambient for this step is HBr/Cl$_2$/O$_2$. The bottom silicon oxide 221 is then gently etched out by buffered (with for example water or ammonium hydroxide) hydrofluoric acid (BHF), or Vapor HF or a reactive ion etch such as CF$_4$/O$_2$. A composite layer of oxide-nitride-oxide (ONO) 230 is formed. Layer 230 is shown without the 3 layers for simplicity in most of the drawings. However, the composite layer is also shown in detail in FIG. 6a wherein the bottom silicon oxide layer is 600, the silicon nitride layer is 601 and the top silicon oxide layer is 602. The bottom silicon oxide is preferred to be grown thermally and the thickness is slightly thicker than the limit of direct tunneling (3.6 nm) and is between about 3.6 to 5 nm, the silicon nitride layer deposited by chemical vapor deposition is between about 2 to 5 nm and the top silicon oxide layer is deposited by chemical vapor deposition and is between about 4 to 6 nm. The silicon nitride layer 301 becomes the storage layer for the device. Thermal oxidation is added after the top layer is deposited to improve the top layer quality. A short nitridation process in an N$_2$O environment can be used prior to the deposition of silicon nitride layer to improve the silicon oxide reliability. Then the polysilicon layer 245 is finally etched vertically using the silicon nitride layer and the underneath silicon oxide as the etch mask, as shown in FIG.

2h. Thus logic, high voltage, and memory word devices are defined together.

Low dosage N+ Arsenic/Phosphorus (As/P) junction compared to logic S/D N+ junction is formed to minimize the gate edge implant damage and sufficient junction overlap for erase. As implant condition is between about 1 E 15 to 3 E 15 atoms/cm2 at about 30 KEV energy and Phorphosus between about 5 E 14 to 1.5 E 15 at 30 KEV energy to produce regions 204 and 205.

Figure 2I:
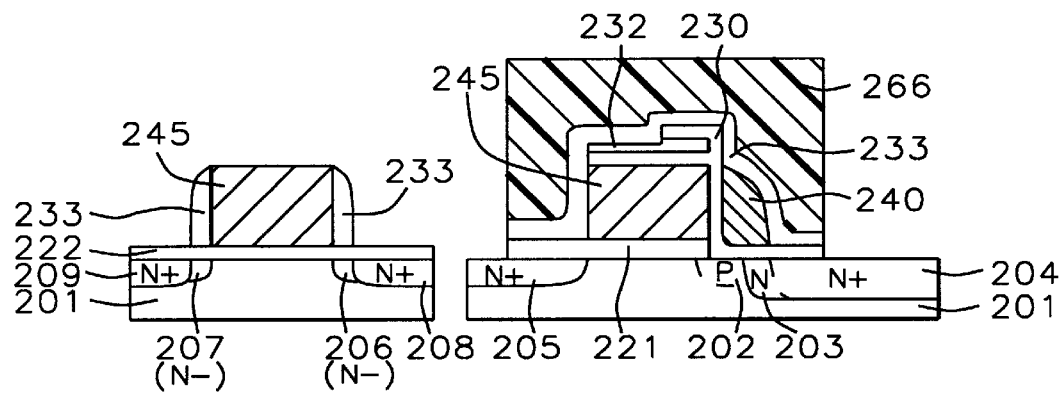
Figure 2J:
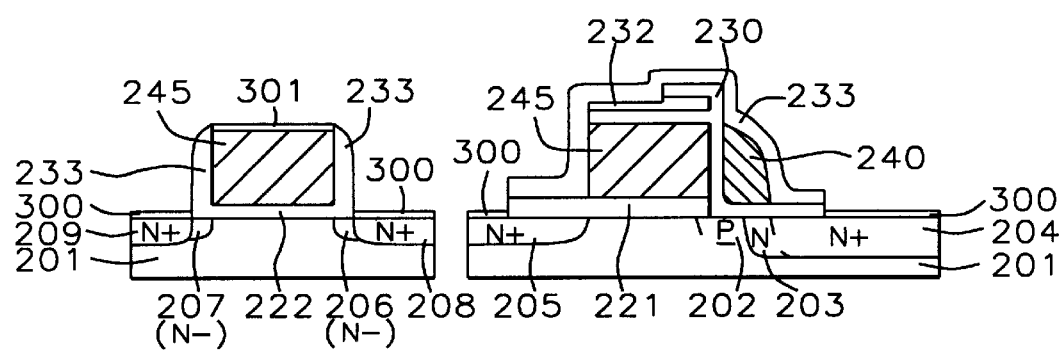

Referring now to FIG. 2i, during the formation of the composite layer of silicon nitride or silicon oxide sidewall insulator 233 can be combined with logic gate sidewall spacer. The preferred silicidation process uses about 10 nm titanium or cobalt deposition and a Rapid Thermal Anneal at about 650° C. The stage after silicidation is shown in FIG. 2j wherein the contacts to the logic devices are for source/drain regions 206 is metal silicide layer 300 and gate is metal silicide layer 301. The contacts to the source/drain of the memory devices are metal silicide layer 300.

Figure 3:
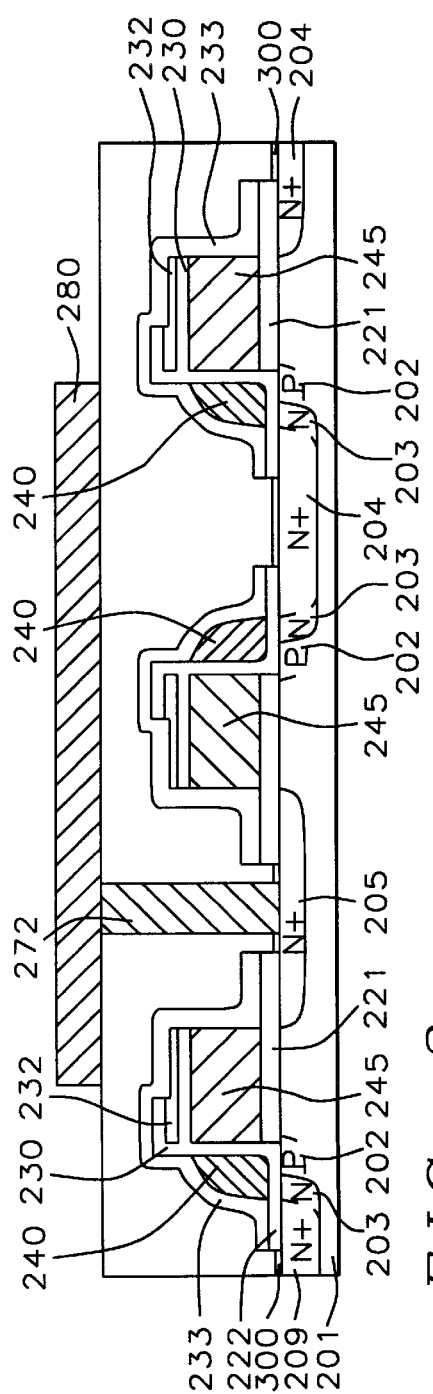
FIG. 3 shows the final device structure for a split gate with a controlable ultra short channel.
Figure 4:
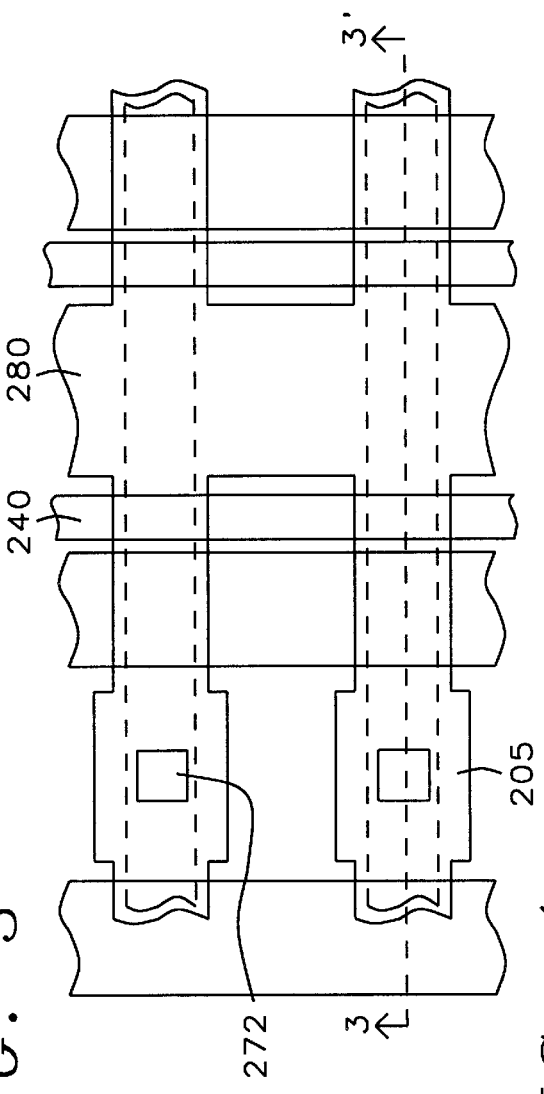
FIG. 4 shows the top view of a split gate transistor, with sidewall short channel. The step split transistor has step under the MONOS sidewall spacer gate.

Referring now to FIGS. 3 and 4, conventional passivation, contact hole metallurgy 272 and next level metal layer 280 formation are formed as shown in FIG. 3, at the process end. A typical bird's-eye view the memory cell is shown in FIG. 4. FIG. 3 is a cross-sectional representation taken along line 3:3' of FIG. 4. The preferred metals used are tungsten for the metal 272 and aluminium or copper doped aluminium for metal 280.

Figure 5:
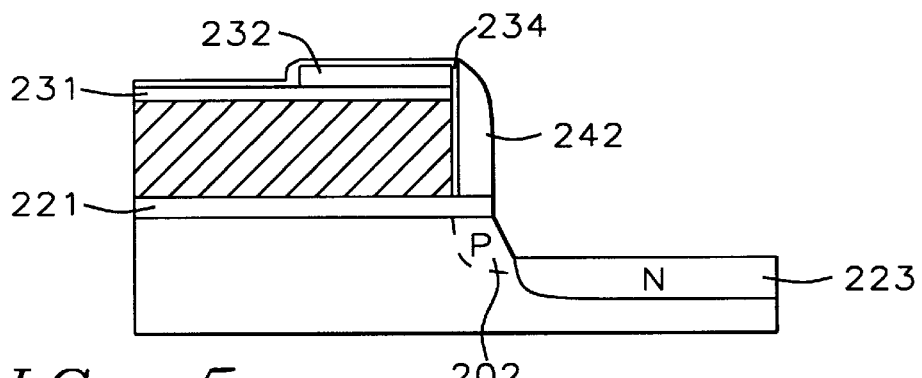
FIG. 5 shows another embodiment of the invention.

The preceding procedures describe fabrication of planar channel MONOS memory cell. By modifying and adding a few process steps, a step split structure as seen in FIG. 5 can be fabricated using the same innovative process integration scheme. The first of the process modifications is that thermal oxidation (233 in FIG. 2c) of the polysilicon side wall is substituted with CVD silicon oxide conformal deposition 234 of between about 4 to 7 nm as shown in FIG. 5. Then the polysilicon layer 242 for disposable spacer should be doped N+ during the deposition by insitu doping, shown in FIG. 2d. Then side wall spacer 242 is formed by vertical RIE as shown in FIG. 5, the silicon oxide layer 221 is vertically etched, and the step is etched into silicon substrate and bottom of the step is lightly implanted 223, as shown in FIG. 5. Then the N+ doped polysilicon disposable spacer is anisotropically plasma or hot phosphoric acid etched selectively to the lightly doped bulk N-region. The source bulk etching during this disposable spacer can be included as part of step etching. After gently etching off the leftover gate oxide 221 under disposable polysilicon spacer, the silicon surface is cleaned. Also, corner rounding by rapid thermal annealing (RTA) at between about 1000 to 1100° C. at between about 10 to 30 seconds or 900° C. in a $H_2$ environment can be added as an option at this point. After these modifications and additions, the fabrication sequence returns to the procedures described previously. By continuing with deposition of the composite layer of oxide-nitride-oxide 230 in FIG. 2e, and otherwise following the process steps given for the planar split device, the step split MONOS device can be fabricated, as shown in FIGS. 2e to 2j.

In the above process steps for both the planar and step devices, the disposable side wall spacer 242 can be plasma silicon oxynitride, borophophosilicate glass (BPSG) or the like, since the etching rate of that material to thermal silicon oxide can be very high (for example at least 10 times). The plasma formed silicon oxynitride spacer of between about 40 to 50 nm can be removed safely, providing the same structures as shown in FIG. 2d and FIG. 5.

Figure 6A:
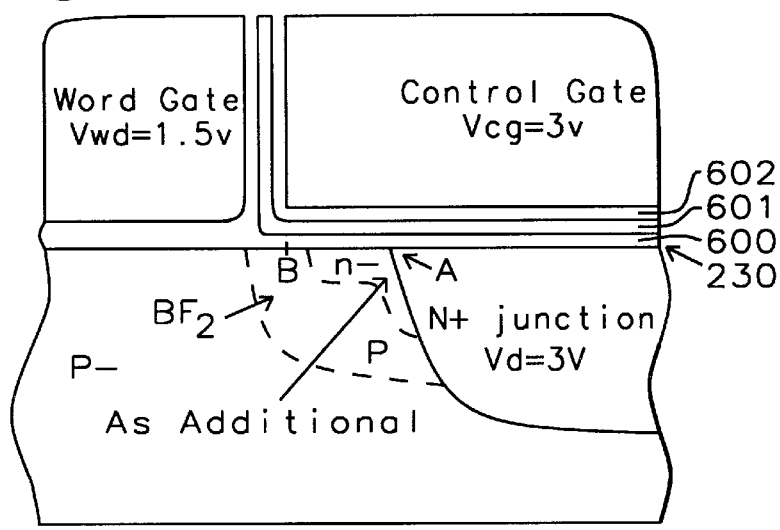
FIGS. 6a and 6b show a shallow As implant in Control gate channel region in addition to Boron channel implant. Widened hot electron temperature region is achieved in 2D numerical simulation due to lower $V_T$, which enhances ballistic injection and also enables single polysilicon sidewall gate process without disposable sidewall spacer.

Referring now more particularly to FIGS. 6a there is shown an electrically programmable read-only, split gate MONOS memory device having a composite of silicon oxide-nitride-oxide layer 230 underneath the control gate in which high efficiency of channel hot electron injection from channel to silicon nitride can be achieved. The bottom silicon oxide layer is 300, the silicon nitride layer is 301 and the top silicon oxide layer is 302.

Figure 6B:
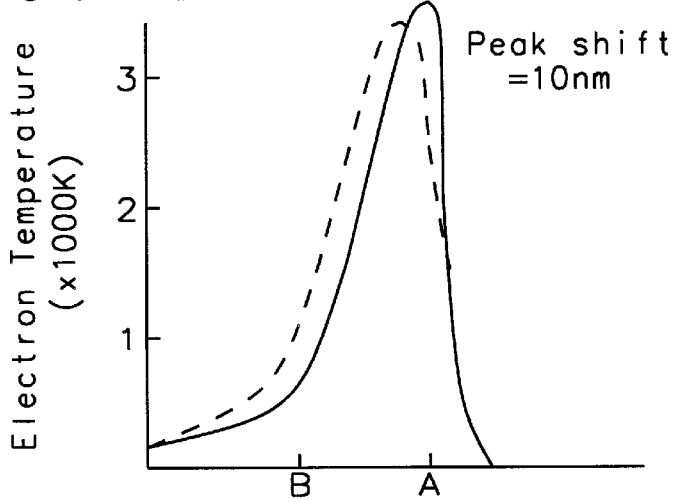

FIG. 6b shows a plot of electron temperature vs silicon surface location. The points A and B on the X-axis of FIG. 6b are at the locations shown on FIG. 6a. Shallow As is implanted in the control gate channel region, as shown in FIG. 6a in addition to Boron channel implant. Widened hot electron temperature region is achieved in 2D numerical simulation due to lower $V_T$, which enhances ballistic injection and also enables single polysilicon sidewall gate process without disposable sidewall spacer.

For process simplicity, it is ideal to control ultra short channel by a single sidewall spacer gate instead of double sidewall spacer (disposable sidewall spacer and final gate sidewall gate). However, when the N+ junction depth is about 100 nm (lateral outdiffusion is about 60 nm), the final spacer gate has to be 100 nm in order to achieve 40 nm for example. The typical sidewall spacer controls within 8%, then the final spacer gate varies 8 nm=100×8%. Adding this 8 nm to outdiffusion variation, the control gate varies about 10 nm, which means that the channel length varies form about 30 nm to 50 nm. The channel is doped with boron and relatively high concentration of about 0.5 E 18 to 3 E $18/cm_3$. This variation causes too much programming speed variation. Therefor, the usage of disposable spacer is used (for example, a 40 nm disposable spacer causes only 3 nm variation).

However, when boron is implanted between about 0.5 E 13 to 2 E 13 atoms/$cm_2$ at between about 5 to 12 kev in FIG. 2c, shallow As is also implanted at the same time at about 0.5 E 13 to 1.5 E 13 at the same KEV range as is the boron. The result is an As implant region N- of about 0.5 E 13 to 3 E 13 atoms/$cm^3$ and a P region of boron (BF2) as seen in FIG. 6a. Even though the channel threshold is very low due to As compensation, there is plenty of impurity to create channel potential drop in short channel region and peak electric field widens as seen in 2D numerical simulation in FIG. 6b. The the same time the peak electric field shifts toward channel region from original N+ junction edge. These effects reduces channel length dependence and the electron injection point becomes ideal position to control channel current in MONOS memory transistor. The conventional N-Fet channel is purely boron doped, but this invention utilizes both acceptor and donor types of impurities in the channel region which enhances potential drop within a certain channel length and make shifts peak electric position. As the result, the same peak electric field for pure boron channel can be achieved even with 5 nm larger channel length, which gives the controlable program speed with single spacer gate process.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an electrically programmable read only memory device which is a word gate and a control gate wherein the word gate is on the sidewall of the control gate comprising:

provideing a stack of layers on a silicon substrate, which layers include a gate silicon oxide layer, a conductive polysilicon gate layer, a silicon oxide layer and a silicon nitride layer; etching said silicon
nitride layer to the dimension of said word gate;
forming a block out mask over said silicon nitride layer of the dimension of said control/word gate to allow only the side uncovered to which said word gate is to be formed;
vertically etching said stack of layers to said gate silicon oxide layer to form a vertical sidewall while using said silicon nitride layer on said side uncovered as the mask;
removing said block out mask;
forming a insulator layer on said vertical sidewall;
forming a disposable sidewall spacer layer on said vertical sidewall over said insulator layer, wherein the width of said spacer layer is the channel for said device;
ion implanting a N type dopant into said substrate to form a device region therein;
removing said disposable sidewall spacer layer;
removing the exposed gate silicon oxide layer;
forming a composite layer of silicon oxide, silicon nitride and silicon oxide over said vertical sidewall and device region; and
forming said control gate sidewall spacer on said vertical sidewall and said composite layer.

2. The method of claim 1 wherein said channel is planar.

3. The method of claim 1 wherein said channel is non-planar and further comprising:
vertically etching into said substrate after said forming a disposable sidewall spacer layer and before said ion implanting to form said non-planar channel.

4. The method of claim 1 wherein said disposable sidewall spacer is composed of polysilicon.

5. The method of claim 1 wherein said disposable sidewall spacer is composed silicon oxynitride and borophosphosilicate glass.

6. The method of claim 1 wherein said channel length is between about 30 to 60 nm.

7. The method of claim 1 and further comprising:
forming logic devices in non-memory device area and using simultaneous process steps to form both logic and memory elements.

8. The method of claim 1 wherein said conductive polysilicon layer includes a refractory metal silicide over said polysilicon layer and a silicon nitride layer between said metal silicide layer and said polysilicon layer.

9. The method of claim 1 wherein before forming said disposal sidewall spacer layer, simultaneously implanting Arsenic and Boron dopant which results in doping the control gate channel region in the finished device and enhances ballistic injection.

10. The method of claim 1 wherein the thickness of said bottom silicon oxide layer is between about 3.6 to 5 nm, said silicon nitride layer is between about 2 to 5 nm and the top silicon oxide layer is between about 4 to 6 nm.

11. A method of fabricating an electrically programmable read only memory device which is a word gate and a MONOS control gate on the sidewall of the word gate while also fabricating logic gates associated therewith in the same silicon substrate comprising:
providing a stack of layers on a silicon substrate, which layers include a gate silicon oxide layer, a conductive polysilicon gate layer, a silicon oxide layer and a silicon nitride layer;
etching said silicon nitride layer to the dimension of said control/word gate in the memory cell area and to the dimension of the logic gate in the non-memory areas;
forming a block out mask over said silicon nitride layer of the dimension of said word gate to allow only the side uncovered to which said control gate is to be formed;
vertically etching said stack of layers to said gate silicon oxide layer to form a vertical sidewall while using said silicon nitride layer on said side uncovered as the mask;
removing said block out mask;
forming a insulator layer on said vertical sidewall;
simultaneously ion implanting boron and arsenic ions into the exposed substrate which results in doping the control gate channel region in the finished device and enhances ballistic injection;
forming a disposable sidewall spacer layer on said vertical sidewall and over said insulator layer, wherein the width of said spacer layer is the channel for said device;
ion implanting a N type dopant into said substrate to form a device region therein;
removing said disposable sidewall spacer layer and the exposed said gate silicon oxide layer;
forming a composite layer of silicon oxide, silicon nitride and silicon oxide over said vertical sidewall and over said channel and said device region;
forming said control gate sidewall spacer on said vertical sidewall and over said composite layer, and over the channel;
forming a second block out mask over said silicon nitride layer to cover and protect said control/word gate and said control gate and to allow all other areas to be uncovered;
removing the exposed said silicon oxide layer;
vertically etching said polysilicon layer to said gate silicon oxide layer to form a vertical sidewall on the opposite side of said control gate in the memory device area and to form the logic device gates in the said logic areas while using said silicon nitride layer on said side uncovered as the mask;
removing said second block out mask; and
forming lightly doped drain devices by ion implantation and forming sidewall spaces using a sidewall spacer technique in said logic areas at said logic gates.

12. The method of claim 11 wherein the sidewall spacers formed by said sidewall spacer technique is composed of the same material and formed at the same time as the protecting insulating layer over said memory device.

13. The method of claim 11 wherein said channel is planar.

14. The method of claim 11 wherein said channel is non-planar and further comprising:
vertically etching into said substrate after said forming a disposable side wall spacer layer and before said ion implanting to form said non-planar channel.

15. The method of claim 11 wherein said disposable sidewall spacer is composed of polysilicon.

16. The method of claim 11 wherein said disposable sidewall spacer is composed of plasma deposited silicon oxynitride.

17. The method of claim 11 wherein said channel length is between about 30 to 60 nm.

18. A method of fabricating an electrically programmable read only memory device which is a word gate, and a MONOS control gate on the sidewall of the word gate, and an ultra short, non-planar channel comprising:
providing a stack of layers on a silicon substrate, which layers include a gate silicon oxide layer, a conductive polysilicon gate layer, a silicon oxide layer and a silicon nitride layer;

etching said silicon nitride layer to the dimension of said word gate;

forming a block out mask over said silicon nitride layer of the dimension of said control/word gate to allow only the side uncovered to which said control gate is to be formed;

vertically etching said stack of layers to said gate silicon oxide layer to form a vertical sidewall while using said silicon nitride layer on said side uncovered as the mask;

removing said block out mask; forming a insulator layer on said vertical sidewall;

forming a disposable sidewall spacer layer on said vertical sidewall over said insulator layer, wherein the width of said spacer layer is the channel for said device;

vertically etching into said substrate to form a step within said substrate;

ion implanting a N type dopant into said step within said substrate to form a device region therein having said non-planar channel;

removing said disposable sidewall spacer layer and the exposed said silicon oxide gate layer;

forming a composite layer of silicon oxide, silicon nitride and silicon oxide over said vertical sidewall and over said channel and said device region; and forming said floating gate sidewall spacer over said composite layer and said vertical sidewall and over said channel.

19. The method of claim 18 wherein said disposable sidewall spacer is composed of polysilicon.

20. The method of claim 18 wherein said disposable sidewall spacer is composed of silicon oxynitride.

21. The method of claim 18 wherein said channel length is between about 30 to 60 nm.

22. The method of claim 18 and further comprising:

forming logic devices in non-memory device area and using simultaneous process steps to form both logic and memory elements.

23. The method of claim 18 wherein before forming said disposal sidewall spacer layer, simultaneously implanting Arsenic and Boron dopant which results doping the control gate channel region in the finished device and enhances ballistic injection.

24. The method of claim 18 wherein the thickness of said bottom silicon oxide layer is between about 3.6 to 5 nm, said silicon nitride layer is between about 2 to 5 nm and the top silicon oxide layer is between about 4 to 6 nm.

* * * * *